(12) United States Patent
Sekihara et al.

(10) Patent No.: US 7,901,527 B2
(45) Date of Patent: Mar. 8, 2011

(54) MICROCHIP MANUFACTURING METHOD

(75) Inventors: Kanji Sekihara, Toyokawa (JP); Masayoshi Uehira, Osaka (JP)

(73) Assignee: Konica Minolta Opto, Inc., Tokyo (JP)

( * ) Notice: Subject to any disclaimer, the term of this patent is extended or adjusted under 35 U.S.C. 154(b) by 12 days.

(21) Appl. No.: 12/528,989

(22) PCT Filed: Feb. 21, 2008

(86) PCT No.: PCT/JP2008/052948
§ 371 (c)(1),
(2), (4) Date: Aug. 27, 2009

(87) PCT Pub. No.: WO2008/108178
PCT Pub. Date: Sep. 12, 2008

(65) Prior Publication Data
US 2010/0012255 A1    Jan. 21, 2010

(30) Foreign Application Priority Data
Mar. 2, 2007  (JP) .................. 2007-052511

(51) Int. Cl.
*B32B 38/10* (2006.01)
*B29C 65/08* (2006.01)
(52) U.S. Cl. .............. 156/73.1; 156/247; 156/272.8; 156/275.5; 156/292; 156/344
(58) Field of Classification Search .............. 156/73.1
See application file for complete search history.

(56) References Cited

U.S. PATENT DOCUMENTS
6,450,895 B1 * 9/2002 Galluzzo, Jr. ................ 473/279

FOREIGN PATENT DOCUMENTS

| JP | 2002-139419 | 5/2002 |
|----|-------------|--------|
| JP | 2004-202336 | 7/2004 |
| JP | 2005-074796 | 3/2005 |
| JP | 2005-077218 | 3/2005 |
| JP | 2005-077239 | 3/2005 |
| JP | 2005-080569 | 3/2005 |
| JP | 2005-103398 | 4/2005 |
| JP | 2005-114414 | 4/2005 |
| JP | 2005103398 A * | 4/2005 |
| JP | 2006-184010 | 7/2006 |

* cited by examiner

*Primary Examiner* — Philip C Tucker
*Assistant Examiner* — Vicki Wu
(74) *Attorney, Agent, or Firm* — Cohen Pontani Lieberman & Pavane LLP

(57) ABSTRACT

Provided is a microchip manufacturing method by which a functional film is formed in a flow path channel and resin microchip substrates are bonded. The manufacturing method has a first step of forming SiO2 films (12, 22) representing the functional films on a surface having a flow path channel (11) of a microchip substrate (10) and on a surface having a flow path channel (21) of a microchip substrate (20) respectively; a second step of exfoliating the $SiO_2$ films formed on the microchip substrates (10, 20) except the $SiO_2$ films formed on the flow path channels (11, 21) by a cohesive member; and a third step of placing the microchip substrates (10, 20) one over another in such a way that the surfaces on which the flow path channels (11, 21) are formed face inside, and bonding the substrates by laser welding, ultrasonic wave welding or thermocompression bonding.

11 Claims, 3 Drawing Sheets

MICROCHIP MANUFACTURING METHOD

RELATED APPLICATIONS

This is a U.S. National Phase Application under 35 USC 371 of International Application PCT/JP2008/052948 filed on Feb. 21, 2008.

This application claims the priority of Japanese application no. 2007-052511 filed Mar. 2, 2007, the entire content of which is hereby incorporated by reference.

TECHNICAL FIELD

The present invention relates to a manufacturing method of a microchip having a micro flow path of which inner surface is coated with a functional film.

BACKGROUND

A microchip or a device called μTAS (Micro Total Analysis Systems) is in practical use, in which a micro flow path and a circuit are formed on a silicon or a glass substrate using a micro forming technology, so as to perform chemical reaction, isolation or analysis of liquid reagents such as nucleic acid, protein and blood in a micro space. Advantages of such microchip are to reduce amounts of samples and regents to be used and an emission amount of waste fluid, thereby realizing an economical system which is portable and space saving.

The microchip is manufactured by bonding two members wherein at least one of the two members has been subject to micro forming. Conventionally, a glass substrate is used for the microchip and various micro forming methods have been suggested. However, the glass substrate is not suitable for mass production, since it is extremely expansive, thus development of a disposable and low-cost microchip formed by a resin is desired.

The resin microchip is formed by bonding a resin microchip substrate having a surface on which a flow path channel is formed and a resin microchip substrate to serve as a cover of the flow path channel in a way that the surface on which the flow path channel is formed faces inside.

As the method of bonding the microchip substrate, there are cited a bonding method using an adhesive, a bonding method to meld the surfaces of the resin by an organic solvent (for example, Patent Document 1), a bonding method using ultrasonic wave welding (for example, Patent Document 2), a bonding method using thermocompression (for example, Patent Document 3) and a bonding method using laser (for example, Patent document 4).

For an element such as the microchip having a micro flow path through which liquid flows so as to perform examination, the flow path has been subject to a functional process. As the functional process, for example, a process to provide a hydrophilic property to the surface of the flow path is carried out so that the flow path does not absorb protein and so forth. For example, coating with a $SiO_2$ film possesses a sufficient hydrophilic property, being characterized by high transparency and stability because of an inorganic material. Also, a film using a fluorine series resin to acquire a water-repellent property against a liquid reagent and a function to selectively absorb molecule is an example of the functional film.

As processes to acquire the functionality such as the hydrophilic property on the flow path surface, coating with organic or inorganic substance and a dipping by flowing a solution inside the flow path are cited. Among the above methods, functional film forming by CVD or by sputtering realizes the film having a sufficient functionality effect and adhesiveness in respect to the flow path surface as well as uniformity of the film depending on kind of the film.

Meanwhile, since the width of the micro flow path is several μm, it is difficult to form the functional film only on the inner surface of the flow path channel by masking on the microchip substrate. In particular, in case a pattern of the flow path channel formed on the surface is complicated, forming of the functional film by patterning so that the position of the pattern coincides is difficult. Thus, in the past the functionally film has been formed on an entire surface including the flow path channel with respect to the resin microchip substrate having a surface on which the flow path channel has been formed, thereafter the resin microchip substrate has been bonded with the resin microchip substrate to be a counter part with the surface on which the flow path channel faced inside, whereby the resin microchip has been manufactured.

However, in case the functionally film is formed on the entire surface including the flow path channel, the functional film is formed also on the bonding surface to be bonded with the microchip substrate representing the counter part and since the resins do not contact each other at the bonding surfaces, bonding of microchip substrates becomes very difficult.

Namely, in case the functional film is not formed on the resin microchip substrate, the microchip substrates can be bonded through ultrasonic wave welding, thermocompression welding or laser welding. In any of the above methods, resin surfaces of the substrates are melted and cured again so as to bond the resin microchip substrates one another. However, in case the functional film exists on the bonding surfaces, bonding of the microchip substrates becomes difficult.

Conventionally, as a method to form the $SiO_2$ film on the inner surface of the flow path formed on the microchip, the $SiO_2$ film is formed inner surface of the flow path by flowing a silicofluoride hydroacid solution into the flow path. (For example Patent document 5).

Patent Document 1: Unexamined Japanese Patent Application Publication No. 2005-80569

Patent document 2: Unexamined Japanese Patent Application Publication No. 2005-77239

Patent document 3: Unexamined Japanese Patent Application Publication No. 2005-77218

Patent document 4: Unexamined Japanese Patent Application Publication No. 2005-74796

Patent document 5: Unexamined Japanese Patent Application Publication No. 2002-139419

DISCLOSURE OF THE INVENTION

Problems to be Resolve by the Invention

In the method disclosed in the Patent Document 5, forming of a uniform film an the inner surface of the microchip is difficult and an adhesive force of the functional film is weakened.

To form a functional film having a strong adhesive force and a uniform thickness, the functional film can be formed by CVD or sputtering method. However, as mentioned above, since the functional film was formed on an entire surface including the flow path channel before the microchip substrates were bonded each other, the functional film was formed on the bonding surfaces as well, and bonding of the microchip substrates was difficult.

Also, in case the functional film is formed on the surface including the flow path channel, as mentioned above, since bonding of the microchip substrates by ultrasonic wave welding, thermocompression or laser welding is difficult, an adhesive is used for bonding the microchip substrates.

However, in case the microchip substrates are bonded each other by the adhesive, there is a possibility that the adhesive exudes into the micro flow path and the micro flow path is clogged. Also, the function of the functional film is discouraged.

As above, it was difficult to form the functional film in the inner surface of the micro flow path without forming the micro film on the bonding surfaces and to bond the microchip substrates one another without using the adhesive.

The present invention is to resolve the aforesaid problems, and an object of the present invention is to provide the microchip manufacturing method which enables forming of the functional film on the inner surface of the flow path and bonding of the resin microchip substrates without clogging the micro flow path and discouraging the function of the functional film.

Means to Resolve the Problems

Item (1): A manufacturing method of a microchip having two resin substrates wherein a flow path channel is formed on a surface of at least one of the two resin substrates and the two resin substrates are bonded in such a way that the surface on which the flow path channel is formed faces inside, having the steps of: forming a functional film on the surface on which the flow path channel is formed, which represents a first step; delaminating the functional film by a cohesive member after the cohesive member is adhered on the surface on which the functional film is formed, except on a surface of the flow path channel, which represents a second step; and bonding the two resin substrates after the second step in a way that the surface on which the flow path channel is formed faces inside, which represents a third step.

Item (2): The manufacturing method of the microchip of item 1 wherein, the flow path channel is formed on each surface of the two resin substrates, and the two resin substrates are bonded in such a way that the surfaces on which the flow path channels are formed face inside and positions of the flow path channels are aligned for bonding in the a third step.

Item (3): The manufacturing method of the microchip of item 1 or 2, wherein the functional film is a $SiO_2$ film.

Item (4): The manufacturing method of the microchip of any one of items 1 to 3, wherein the functional film is formed by coating and curing a coating solution of the functional film on the surface on which the flow path channel is formed in the first step.

Item (5): The manufacturing method of the microchip of any one of items 1 to 3, wherein the functional film is formed by sputtering in the first step.

Item (6): The manufacturing method of the microchip of any one of items 1 to 3, wherein the functional film is formed by CVD in the first step.

Item (7): The manufacturing method of the microchip of any one of items 1 to 6, wherein the two resin substrates are bonded by melting bonding surfaces in such a way that the surfaces on which the flow path channels are formed face inside in the third step.

Item (8): The manufacturing method of the microchip of any one of items 1 to 7, wherein the bonding surfaces are melted by heating the two resin substrates, and the two resin substrates are bonded by pressing the two resin substrates in such a way that the surfaces on which the flow path channels are formed face inside in the tired step.

Item (9): The manufacturing method of the microchip of any one of items 1 to 7, wherein the bonding surfaces are melted by applying ultrasonic waves onto the two resin substrates, and the two resin substrates are bonded by pressing the two resin substrates in such a way that the surfaces on which the flow path channels are formed face inside in the tired step.

Item (10): The manufacturing method of the microchip of any one of items 1 to 7, wherein the bonding surfaces are melted by radiating laser onto the two resin substrates, and the two resin substrates are bonded by pressing the two resin substrates in such a way that the surfaces on which the flow path channels are formed face inside in the tired step.

Items (11): The manufacturing method of the microchip of any one of items 1 to 10, wherein the cohesive member is in a shape of a sheet.

EFFECT OF THE INVENTION

According to the present invention, the function film can be formed on the surface except the surface of the flow path channel can be exfoliated by using the cohesive member. Whereby the resin is bared on the bonding surface of the resin substrate and the resins can be in contact one another. Thus, the resin substrates can be bonded directly using bonding methods such as thermocompression, ultrasonic wave welding or laser welding which do not cause clogging of the micro flow path and discouraging of the function of functional film.

Also, according to the present invention, the flow path channels are formed on the tow resin substrates, the functional film is formed on the inner surface of the flow path channel of each resin substrate and positioning of the micro flow paths is carried out. Whereby, the inner surface of the flow path formed by the flow path channels can be covered by the functional films.

Figure 1A:
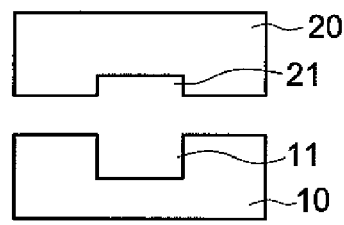
FIGS. 1a, 1b, 1c and 1d are cross-sectional views of microchip substrates describing a microchip manufacturing method related to a first embodiment of the present invention.

DESCRIPTION OF THE SYMBOLS 10, 20, 50, 60, 80 and 90: Microchip substrates
11, 21, 51, 61, 81 and 91: Flow path channels
12, 13, 22, 23 and 41: $SiO_2$ films
30: Microchip
31: Micro flow path
40: Cohesive member
70. Table
100: Substrate

DESCRIPTION OF THE PREFERRED EMBODIMENTS

First Embodiment

A microchip manufacturing method related to a first embodiment of the present invention will be described with reference to FIGS. 1a, 1b, 1c and 1d. FIGS. 1a, 1b, 1c and 1d are cross-sectional views of microchip substrates to describe a microchip manufacturing method related to a first embodiment of the present invention.

As FIG. 1a shows, on a surface of the resin microchip substrate 10, a flow path channel 11 extending along the surface is formed. Also, on the surface of the resin microchip substrate 20, a flow path channel 21 extending along the surface is formed. The flow path channel 11 and the flow path channel 21 are formed in patters which coincide each other when they face each other. The flow path channels 11 and 12 are in a shape of a channel along the surfaces. By bonding the microchip substrate 10 and the microchip substrate 20 in the way that the surfaces on which the flow paths 11 and 12 are formed come inside, the microchip in which the micro flow path is formed is produced. Meanwhile, the microchip substrates 10 and 20 represent an example of "resin substrate" of the present invention.

On the microchip substrate 10, a through-hole is formed by penetrating the substrate. The through hole is formed so as to be in contact with the flow path channel 11, and becomes an opening section to connect an outside with the flow path channel 11 by bonding the microchip substrate 10 and the microchip substrate 20. The opening section is a hole to charge, preserve and discharge gel, reagent and buffer fluid. The opening section can be a circular shape, a rectangular shape or various shapes. To the opening section, tubes and nozzles provided at an analyzing apparatus are connected so as to charge or discharge the gel, reagent and buffer fluid to/from the flow path channel 11. Meanwhile, the opening section can be formed by forming a through hole on the microchip substrate 20.

A resin is used for the microchip substrate 10 and 20. As conditions of the resin, superior formability (transformability, and mold releasability), high transparency, low self-fluorescence with respect to ultraviolet light and visible light are cited without the resin being limited to the conditions thereof. For example, Polycarbonate, a PMMA, polystyrene, Poly-acrylonitrile, polyvinylchloride, polyethylene terephthalate, polyamide system resin, a polyvinyl acetate, PVDC, polypropylen, polyisoprene, polyethylene, poly dimethyl siloxane and cyclic polyolefin are preferred. In particular, PMMA and cyclic polyolefin are preferred. The same material or different materials can be used for the microchip substrate 10 and the microchip substrate 20.

The microchip substrates 10 and 20 can be in any shapes as far as they are suitable for handling and analysis. For example, a size of 10 to 200 millimeters square is preferred and 10 to 100 millimeters square is more preferable. The shapes of the microchips 10 and 20 have only to be adjusted to analysis methods or analysis apparatuses and a square shape, a rectangular shape, and a circular shape or a combination of the shapes thereof are preferred.

The flow path channel 11 is preferred to be 10 μm to 200 μm in a width and 30 μm to 200 μm in a depth from viewpoints of reducing consumption of the sample and the reagent, as well as forming accuracy, transformability and mold releasability of the metal mold without being limited to the values thereof. Also an aspect ration, (depth of channel/width of channel) is preferred to be around 0.1 to 3 and more preferably around 0.2 to 2. Also, the width and depth of the flow path channel 11 can be determined in accordance with usage of the microchip. Meanwhile, the shape of a cross-section of the flow path channel 11 shown in FIG. 11 is rectangular so as to simplify the descriptions. However, the shape is an example of the flow path channel 11 only and can be a shape of a curved surface.

Also, the width of the flow path channel 21 and the width of the flow path channel 11 are preferred to be the same a value within the range of 10 μm to 200 μm. By equating the widths of the flow path channel 11 and the flow path channel 21 and bonding the microchip substrates 10 and 20 while matching positions of the flow path channel 11 and the flow path channel 21 so as to, a micro flow path having a constant width can be formed. Also, the depth of the flow path channel 21 is preferred to be a value in the rage of 30 μm to 200 μm. The depth of the flow path channel 21 can be the same as or different from that of the flow path channel 11.

Also, the thickness of the microchip substrates 10 and 20 is in the range of around 0.2 mm to 5 mm and preferably 0.5 mm to 2 mm from a viewpoint of moldability.

<Forming Functional Film>

Next, the functional film is formed on a surface of the microchip substrate 10 and 20 in which the flow path channel 11 is formed. A functional film forming process, to be described as follows, to form the functional film on the microchip substrates 10 and 20 serves as a first process in the present invention. Here, as an example of the functional film to be formed, a case of forming a $SiO_2$ film 12 consisting primarily of $SiO_2$ having a hydrophilic function will be described. Meanwhile, an organic material or inorganic material can be used for the functional film.

Figure 1B:
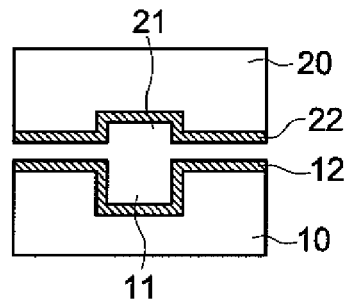

As FIG. 1b shows, as an example of the functional film, the $SiO_2$ film 12 is formed on a surface of the microchip substrate 10 in which the flow path channel 11 is formed, and in the same manner, as an example of the functional film, the $SiO_2$ film is formed on a surface of the microchip substrate 20 in which the flow path channel 21 is formed. For both the microchip substrates 10 and 20, the $SiO_2$ films 12 and 22 are formed on inner surfaces of the flow path channels 11 and 21.

<Forming $SiO_2$ Film in Functional Film Forming Process>

The $SiO_2$ films 12 and 22 can be formed, for example, by vapor-deposition, sputtering, CVD or coating without being limited to the film forming methods thereof. Film forming methods of vapor-deposition, sputtering, and CVD are preferable since the $SiO_2$ films having a preferable adhesion can be formed particularly on a vertical wall surface of the flow path channels 11 and 21.

<Forming of $SiO_2$ Film by Coating>

For example, in case the $SiO_2$ films 12 and 22 are formed by coating, a coating solution to be the $SiO_2$ film after curing is applied on the surface of the microchip substrate 10. Thereafter, by curing the coating solution, the $SiO_2$ films 12 and 22 can be formed on the surfaces of the microchip substrates 10 and 20.

As the coating solution, for example, polysiloxane oligomer, obtained by hydrolyzing and condensing alkoxy silane, is resolved in alcohol solvent and used. In this case, the coating solution is heated to volatilize the alcohol solvent whereby the $SiO_2$ film is formed. As examples of the coating solutions, Glassca 7003™ of JSR Corp. or Methylsilicate 51™ of Colcoat Co., Ltd. are cited.

Also, par hydro poly silazanere solved in a xylene dibutyl ether solvent is used as the coating solution. In this case, the coating solution is heated to volatilize the solvent and at the same time, reacted with water so as to form the $SiO_2$ film. As an example of the coating solution, Aquamica™ of AZ electronic material is cited.

Also, inorganic/organic hybrid polymer obtain by hydrolyzing and copolycondensing a polymer having alkoxy-silyl-groups and alkoxy silane is resolved in an alcohol solvent and used as the coating solution. In this case, alcohol is volatilized by heat to form a hybrid film consisting primarily of $SiO_2$. As an example of the coating solution, Glasca 7506™ of JSR Corp. is cited.

It is important to apply the coating solution evenly on the microchip substrates 10 and 20. Methods of application are appropriately selected considering physicality (viscosity and volatility) of the coating solution. For example, dipping, spray coating, spin coating, slit coating, screen printing, pad printing and inkjet printing are cited.

By curing the coating solution, the $SiO_2$ films 12 and 22 are formed.

Meanwhile, when the $SiO_2$ film is formed by curing the coating solution, it is preferred to form a strong network of $SiO_2$, by sufficiently volatilize the solvent of the coating solution. Considering the physicality (viscosity, volatility and catalytic) of the coating solution methods of curing is appropriately selected. For example, curing by leaving the coating solution in a room temperature, curing by heating the coating solution in a temperature of 60° C. to 100° C., and curing under a high temperature and a high humidity (a humidity of 90% at a temperature of 60° C. or a humidity of 90% at a temperature of 80° C.) are cited. Also the coating solution can be cured using ultra violet light or visible light.

<Forming $SiO_2$ Film by Sputtering>

The $SiO_2$ films 12 and 22 can be formed on the microchip substrate by spattering. For example, by using a sputtering device (model name: RAS-1100C) of Synchro Co., ltd., the $SiO_2$ films 12 and 22 of 200 nm can be formed under conditions of an argon gas flow amount of 250 sccm, an oxygen gas flow amount of 120 sccm, RF output of 4.5 kw, and a film forming rate of 0.4 nm/sec.

<Forming $SiO_2$ Film by CVD>

The $SiO_2$ films 12 and 22 can be formed on the microchip substrate by CVD wherein liquid sources such as TEOS (Tetra Ethoxy Silane) or TMOS (Tetra, Methoxy Silane) having silicon is vaporized, then degraded and oxidized in a plasma space. For example, by using a CVD device (model name: PD-270ST) of Samco Inc., the $SiO_2$ films 12 and 22 of 200 nm can be formed under conditions of a TEOS flow of 12 sccm, an oxygen gas flow amount of 400 sccm, RF output of 300 W, a pressure of 50 Pa and a film forming rate of 3 nm. A thickness of the SiO2 films 12 and 22 representing the functional film to be formed is determined considering that the inner surface of the flow path channel 11 and 21 are all completely covered by the $SiO_2$ film, adhesion onto the flow path channels 11 and 21 is ensured and the flow path channel is not clogged. In case the $SiO_2$ film is formed by coating, the thickness of the film is adjusted in accordance with characteristics and kinds of the coating solution. For example, the thickness of the film is preferred to be a value in the range of 10 nm to 3 μm and more preferably 10 nm to 2 μm. In case the $SiO_2$ film is formed by sputtering or CVD, and particularly in case of a dense $SiO_2$ film is formed, since an interior stress of the $SiO_2$ film tends to increase, the thickness of the film is preferred to be a value in the rage of 10 nm to 1 μm and more preferably 10 nm to 200 nm.

<Exfoliation of the Functional Film>

Next, the function filed formed on a surface except the surface of the flow path channel is removed. Exfoliation of the functional film in the first embodiment is carried out in a functional film exfoliation process using the cohesive member. The functional film exfoliation process serves as a second process in the present invention, which will be described as follow.

<Exfoliation of Functional Film in Functional Film Delaminating Process>

Figure 1C:
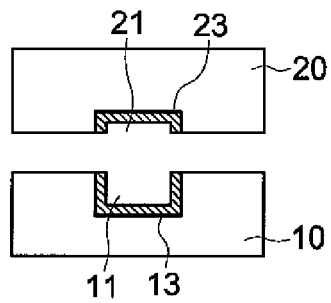
Figure 2A:
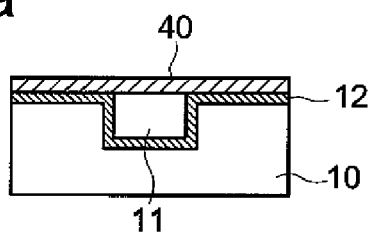
FIGS. 2a and 2b are cross-sectional views of microchip substrates describing a exfoliation process of a functional film in the microchip manufacturing method related to a first embodiment of the present invention.
Figure 2B:
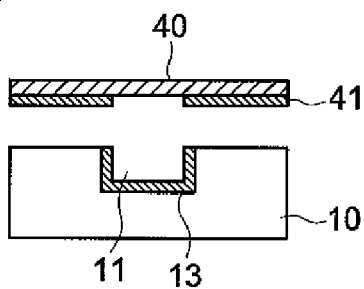

By carrying out exfoliation of the functional film in the functional film delaminating process, as FIG. 1c shows, the $SiO_2$ film except the $SiO_2$ film formed on the inner surface of the flow path channel 11 of the microchip substrate 10 is exfoliated and removed by the cohesive member, and the $SiO_2$ film formed on the inner surface of the flow path channel 11 remains. In the same manner, the $SiO_2$ film except the $SiO_2$ film formed on the inner surface of the flow path channel 21 of the microchip substrate 20 is exfoliated and removed by the cohesive member and the $SiO_2$ film formed on the inner surface of the flow path channel 21 remains. Here, exfoliation of the $SiO_2$ film by the cohesive member in the functional film exfoliation process will be described with reference to FIGS. 2a and 2b. FIGS. 2a and 2b are a cross-sectional view of a microchip substrate to describe the exfoliation process of the functional film in the manufacturing method of the microchip related to the first embodiment of the present invention.

First, as FIG. 2a shows, a cohesive member 40 is adhered on a surface of the microchip substrate 10 on which the flow path channel 11 is formed. As the cohesive member 40, for example, a member in a shape of a sheet such as a adhesive tape is used. As the adhesive tape, for example, an adhesive tape defined by JIS Z1522 is used. As an example, an adhesive tape (No. 405) of Nichiban Co., Ltd. is used.

Also, the cohesive member 40 is preferred to have a thickness of not more than 0.09 mm, a cohesive force of not less than 1.18 $N/cm^2$, and a thickness of a cohesive layer of around 0.03 mm. The above ranges satisfy conditions to remove the functional film formed on the surface except the inner surface of the flow path channel. Namely, the above range is considered without departing form manufacturing conditions that a higher adhesive force of the functional film is selected in the range which does not exceed the cohesive force of the cohesive member.

Also, since the cohesive force of the cohesive member 40 is not less than 1.18 $N/cm^2$, it is preferred that the adhesive force of the SiO2 film is around 1 $N/cm^2$. Thereby, it is possible to exfoliate a portion of the SiO2 film where the cohesive member 40 is adhered while preserving the SiO2 film in the flow path channel 11.

Since the depth of the flow path channel 11 is in the rage of 30 μm to 200 μm, use of such cohesive member 40 prevents the cohesive member 40 from entering into the flow path channel 11 and the SiO2 film 13 formed in the flow path channel 11 can be preserved. Namely, the SiO2 film formed on the inner surface of the flow path channel 11 is not exfoliated, and only the SiO2 film formed on the surface can be exfoliated without exfoliating the SiO2 film on the inner surface of the flow path channel 11. In other words, it is necessary to form the flow path channel 11 with a depth which prevents the cohesive member from entering.

As FIG. 2b shows, by removing the cohesive member 40 from the microchip substrate 10, the SiO2 film formed on the surface except the inner surface of the flow path channel 11 is exfoliated while preserving the $SiO_2$ film 13 formed in the flow path channel 11. In the same manner, for the microchip substrate 20, the cohesive member is adhered on the surface on which the flow path channel 21 is adhered. Then, by removing the cohesive member form the microchip substrate 20, the $SiO_2$ film formed on the surface except the inner surface of the flow path channel 21 is exfoliated while preserving the SiO2 film formed in the flow path channel 21.

Also, since the depth of the flow path channel 21 is in the rage of 30 μm to 200 μm, in the microchip substrate 20, use of the above cohesive member 40 prevents the cohesive member 40 from entering into the flow path channel 21, and the SiO2 film formed on the inner surface of the flow path channel 21 can be preserved. Namely, only the $SiO_2$ film formed on the surface can be exfoliated without exfoliating the $SiO_2$ film formed on the inner surface of the flow path channel 21. In other words, the depth of the flow path channel 11 has only to be a depth to prevent the cohesive member from entering.

As above, in the functional film exfoliation process using the cohesive member, the SiO2 film formed on the surface except the inner surfaces of the flow path channels 11 and 21 can be exfoliated while preserving the SiO2 film on the inner surfaces of the flow path channels 11 and 21. Whereby, on the bonding surfaces of the microchip substrates, the resins are bared.

<Bonding>

Figure 1D:
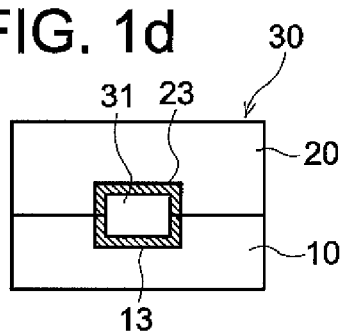

The microchip substrates 10 is placed so that the surface on which the flow path channel 11 is formed faces inside, and the microchip substrates 20 is placed so that the surface on which the flow path channel 21 is formed faces inside. Then the microchip substrates 10 and 20 are bonded while the positions of the flow path channel 11 and the flow path channel 21 coincide each other. The bonding process to bond the two resin substrates with the surfaces on which the flow path channels faced inside serves as a third process of the present invention. The flow path channel 11 and the flow path channel 21 are formed in patterns so that the flow path channels coincide each other when the substrates are faced each other. By bonding the microchip substrates 10 and 20, while aligning the positions of the flow path channel 11 and the flow path channel 21, a micro flow path 31 are configured with the flow path channel 11 and the flow path channel 21. Whereby, as FIG. 1d shows, a microchip 30 in which the micro flow path 31 is formed is formed. The entire inner surface of the micro flow path 31 is covered by the $SiO_2$ films 13 and 23.

Meanwhile, when the microchip substrate 10 is formed by a metal mold, the flow path channel 11 and a positioning section (mark) are formed simultaneously, and when the microchip substrate 20 is formed by a metal mold, the flow path channel 21 and a positioning section (mark) are formed simultaneously, whereby aligning at time of bonding becomes easy.

<Bonding of the Substrates in the Functional Film Exfoliation Process>

Bonding of the microchip substrate 10 and the microchip substrate 20 is carried out by laser welding, ultrasonic welding or thermocompression bonding. Publicly known methods can be utilized for laser welding, ultrasonic welding or thermocompression bonding. For example, for laser welding, a method cited in Unexamined Japanese Patent Application Publication No. 2005-74796, for ultrasonic welding, a method cited in Unexamined Japanese Patent Application Publication No. 2005-77239, and for thermocompression bonding, a method cited in Unexamined Japanese Patent Application Publication No. 2005-77218 can be utilized. The above methods are examples and other publicly known technologies can be utilized.

By applying laser radiation, imposing ultrasonic wave, or applying thermocompression onto the microchip substrates 10 and 20, the resin at the bonding surface between the microchip substrates 10 and 20 melts, and the microchip 10 and 20 are bonded. Since the SiO2 film has been removed from the bonding surfaces of the microchip substrates 10 and 20, the resin can be contact one another at bonding. Whereby, a bonding method to bond the microchip substrates 10 and 20 by melting the resin can be utilized.

For example, in case of thermocompression, the substrates are placed so that the flow path channel 11 and the flow path channel 21 face inside and positioning of the flow path channel 11 and the flow path channel 21 is carried out, then the microchip substrate 10 and the microchip substrate 20 are laid one over another. In the above state, by heating the microchip substrate 10 and the microchip substrate 20, the bonding surfaces melt, then pressure is applied onto the microchip substrate 10 and the microchip substrate 20 so as to bond the substrates. For example, the microchip substrates are heated at a temperature in the range of 70° C. to 200° C. and the microchip substrates are pressed in the state so that both the substrates are bonded.

Also, in case of ultrasonic welding, the substrates are placed so that the flow path channel 11 and the flow path channel 21 face inside and positioning of the flow path channel 11 and the flow path channel 21 is carried out. Then the microchip substrate 10 and the microchip substrate 20 are laid one over another. In the above state, by radiating ultrasonic waves onto the microchip substrate 10 and the microchip substrate 20, the bonding surfaces melt. Further the microchip substrate 10 and the microchip substrate 20 are compressed so as to bond each other. For example, by compressing the microchip substrates while applying ultrasonic wave of 10 kHz to 50 kHz, both the substrates are bond each other.

Also, in case of laser welding, the substrates are placed so that the flow path channel 11 and the flow path channel 21 face inside and positioning of the flow path channel 11 and the flow path channel 21 is carried out. Then the microchip substrate 10 and the microchip substrate 20 are laid one over another. In the above state, laser is radiated onto the microchip substrate 10 and the microchip substrate 20 to melt the bonding surfaces. Further by compressing the microchip substrate 10 and the microchip substrate 20, the substrates are bonded each other. By scanning the microchip substrates with laser having a laser intensity of, for example, 0.1 W to 20 W, the substrates are bonded. As above, since the $SiO_2$ film has been removed form the bonding surfaces of the microchip substrates 10 and 20, the bonding surfaces contact each other. Whereby bonding methods where the microchip substrates 10 and 20 are bonded by melting the resin, can be utilized. Namely, since bonding can be carried by laser welding, ultrasonic welding or thermocompression bonding, the microchip substrates 10 and 20 can be bonded without interposing substances such as adhesives. Whereby there is no possibility that the substance such as an adhesive steeps out into the micro flow path 31.

By forming the flow path channel 21 as well on the microchip substrate 20 which serves as a cover (lid) of the flow path channel 11, and by preserving the $SiO_2$ films 23 inside the flow path channel 21, an entire inner surface of the micro flow path 31 formed by bonding the microchip substrates 10 and 20 can be covered with the $SiO_2$ film 23.

Modification Example

Next, a modification example of the microchip manufacturing method related to the aforesaid first embodiment will be described. In the first embodiment, the flow path channels are formed on both the microchip substrates 10 and 20 and the $SiO_2$ film is formed on both the substrates. In the modification example, a microchip manufacturing method will be described wherein a microchip substrate having the surface on which the flow path channel is formed and a microchip substrate having a plane surface are bonded.

In the modification example, the flow path channel is formed only one microchip substrate, and the functional film (for example $SiO_2$ film) is form on the surface where the flow path is formed in the functional film forming process in the same manner as that of the first embodiment. Then in the functional film exfoliation process, the functional film is exfoliated by the cohesive member except the functional film formed on the inner surface of the flow path channel. Whereby the functional film is preserved only on the inner surface of the flow path channel. Meanwhile, the one microchip substrate represents the microchip substrate 10 described in the first embodiment.

Thereafter, the microchip substrate (microchip substrate 10) in which the flow path channel is formed is placed over the plane microchip substrate which will be a counter part of bonding, in a way that the surface on which the flow path channel is formed faces inside, and then bonded by the same method as in the first embodiment. The plane microchip substrate serves as a cover (lid) of the flow path channel.

As above, even in case the flow path channel is formed on only one microchip substrate, in the same manner as the first embodiment, by using the cohesive member, the functional film formed on the surface except on the surface of the flow path channel, can be exfoliated, and the functional film on the inner surface of the flow path channel can be preserved. Whereby on the bonding surfaces of the microchip substrates, the resin is bared, thus it becomes possible to contact the resin each other. Whereby the microchip substrates can be bonded directly each other using heat.

A thickness of the plane microchip substrate serving as the cover (lid) to enclose the flow path channel is the same as that of the microchip substrate on which the flow path is formed, and is in the rage of approximately 0.2 mm to 5 mm and preferably 0.5 mm to 2 mm from a view-point of moldability.

Also, in case the micro flow path channel is not formed on the microchip substrate to serve as the cover (lid), a film (in a shape of a sheet) can be used for the substrate instead of the member in a shape of a plate. In this case, the thickness of the film is preferably from 30 μm to 300 μm and more preferably 50 μm to 150 μm.

Second Embodiment

Next, a microchip manufacturing method related to the second embodiment of the present invention will be described with reference to the FIG. 3a to FIG. 5b. FIG. 3a to FIG. 5b are cross-sectional views of the microchip substrates to describe the manufacturing method of the microchip related to the second embodiment of the present invention.

In the microchip in which the micro flow path is formed, since the fluid should not exude outside the micro flow path, it is an important factor of bonding to ensure a sealing property of the micro flow path. Also, since the micro flow path channel has to be transferred onto the microchip substrate with a high accuracy, it is difficult to ensure a flatness of the microchip substrate at the same time. When the microchip substrates inferior in the flatness are bonded each other, it is difficult to ensure the adhesion at the bonding surfaces, and the sealing property and adhesion strength are not sufficient.

In the second embodiment, by intentionally bending the microchip substrate in a predetermined direction, a pressing portion of the substrates at bonding of the substrates is confined. Whereby, adhesion between the substrates is enhanced.

Figure 3A:
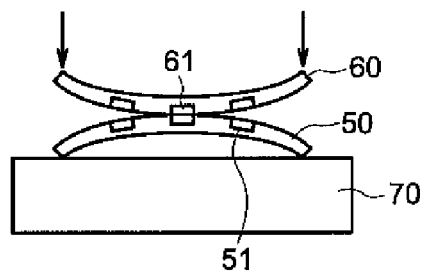
FIGS. 3a and 3b are cross-sectional views of microchip substrates describing a microchip manufacturing method related to a second embodiment of the present invention.

For example, as FIG. 3a shows, a microchip substrate 50 having a surface on which micro flow path channel 51 is formed and a microchip substrate 60 having a surface on which micro flow path channel 61 is formed are bonded. In the same manufacturing method as that of the first embodiment, for the microchip substrate 50, the functional film such as the $SiO_2$ film is formed on a surface on which the flow path channel 51 is formed, thereafter the functional film such as the SiO2 film formed on the surface except the inner surface of the flow path channel 51 is exfoliated by the cohesive member. For the microchip substrate 60, the functional film such as the $SiO_2$ film is formed on a surface on which the flow path channel 61 is formed, thereafter the functional film such as the SiO2 film formed on the surface except the inner surface of the flow path channel 61 is exfoliated by the cohesive member. Whereby, the resin is bared except on the surfaces of the flow path channels 51 and 61.

For example, the microchip substrate 50 is curved across the entire substrate so that the surface on which the flow path channel 51 is formed is a convex surface. In the same manner, the microchip substrate 60 is curved across the entire substrate so that the surface on which the flow path channel 61 is formed is a convex surface. As above, there are formed the microchip substrates 50 and 60 having been curved intentionally across the entire substrates so as to make the bonding surfaces convex. A degree of the curve of the microchip substrates 50 and 60 are preferably to be 1 to 20 μm. Namely a difference between heights of a center portion of the substrate and an end section of the substrate have only to be 1 to 2 μm.

Figure 3B:
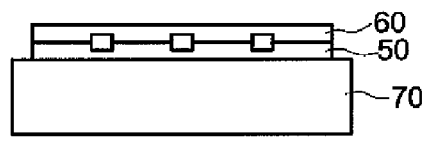

In the bonding process, as FIG. 3a shows, the microchip substrate 50 is placed so that the surface on which the flow path channel 51 is formed faces inside and the microchip substrate 60 is placed so that the surface on which the flow path channel 61 is formed faces inside, then positioning of flow path channels 51 and 61 is performed and then the microchip substrates 50 and 60 are bonded. At this state, as FIG. 3a shows, the microchip substrate 50 is placed on a flat table 70 and by pressing periphery sections of the microchip substrates 50 and 60, the microchip substrates 50 and 60 are bonded. Whereby, as FIG. 3b shows, a microchip in which a micro flow path is formed with the flow path channels 51 and 61 can be formed.

By bonding in the above way, both the substrates conform each other, and an adhesion can be ensured across the bonding surface of the microchip substrates. Namely, by curving the microchip substrates 50 and 60 intentionally so that the bonding surfaces becomes the convex surfaces, the pressure application position of the substrates at bonding the microchip substrates 50 and 60 is defined, and by applying the pressure at the position, the adhesive force between the microchip substrates can be enhanced, thus the substrates can be bonded readily each other. As the result, the sealing property of the micro flow path is enhanced.

Figure 4A:
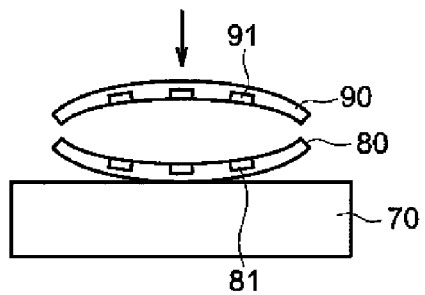
FIGS. 4a and 4b are cross-sectional views of microchip substrates describing a microchip manufacturing method related to a second embodiment of the present invention.

Also, as FIG. 4a shows, a microchip substrate 80 having a surface on which micro flow path channel 81 is formed and a microchip substrate 90 having a surface on which micro flow path channel 91 is formed are bonded. For the microchip substrate 80, in the same manner as the manufacturing method related to the first embodiment, the functional film such as the $SiO_2$ film is formed on the surface where the flow path channel 81 is formed in the functional film forming process then thereafter, the functional filmed such as the $SiO_2$ film formed on the surface except the surface of the flow path channel 81 is exfoliated by the cohesive member. For the microchip substrate 90, the functional film such as the $SiO_2$ film is formed on the surface where the flow path channel 91 is formed, thereafter the functional film such as $SiO_2$ film formed on the surface except the surface of the flow path channels 91 is exfoliated by the cohesive member. Whereby, the functional film such as the SiO₂ film is removed from the surface except the surface of the flow path channels 81 and 91 and the resin is bared.

For example, the microchip substrate 80 is curved across the entire substrate so that the surface on which the flow path channel 81 is formed is a concave surface. In the same manner, the microchip substrate 90 is curved across the entire substrate so that the surface on which the flow path channel 91 is formed is a concave surface. As above, the microchip substrates 80 and 90 having been curved intentionally so that the bonding surfaces are the concave surfaces are formed.

Figure 4B:
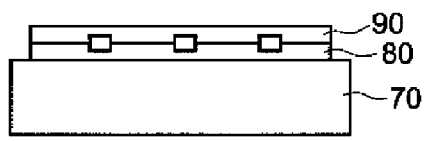

In the bonding process, as FIG. 4a shows, the microchip substrate 80 is placed so that the surface on which the flow path channel 81 is formed faces inside and the microchip substrate 90 is placed so that the surface on which the flow path channel 91 is formed faces inside, then positioning of flow path channels 81 and 91 is performed so as to bond the microchip substrates 80 and 90. At this state, as FIG. 4a shows, the microchip substrate 80 is placed on a table 70 and by pressing a center section of the microchip substrates 80 and 90, the microchip substrates 80 and 90 are bonded. Whereby, as FIG. 4b shows, a microchip in which a micro flow path is formed with the flow path channels 81 and 91 can be formed.

By binding in the above way, the adhesion can be ensured across the bonding surface of the microchip substrates. Namely, by curving the microchip substrates 80 and 90 intentionally so that the bonding surfaces becomes the concave surfaces, the pressure application position of the substrates at bonding the microchip substrates 80 and 90 is defined and by applying the pressure at the position, adhesiveness between the microchip substrates can be enhanced, thus the substrates can be bonded readily each other. As the result, sealing property of the micro flow path is enhanced.

Bonding of the microchip substrates one another in the boding process can be performed by ultrasonic wave welding, laser welding or an adhesive.

In case of ultrasonic wave welding, the microchip substrate is pressed by a hone which generates ultrasonic waves and while the hone is applying pressure, ultrasonic waves are radiated onto the microchip substrate so as to bond the substrates one another. For example, as FIGS. 3a and 3b show, in case the microchips having the convex bonding surfaces are bonded each other, the hone to generate ultrasonic waves presses the entire surface of the microchip substrate 60 and while the hone is applying pressure onto the periphery section of the microchip substrate 60, the ultrasonic waves are radiated onto the microchip substrates 50 and 60 so as to bond the microchip substrates 50 and 60 each other. Also, as FIGS. 4a and 4b show, in case the microchip substrates having the concave surfaces are bonded each other, the hone to generate the ultrasonic waves presses an entire surface of the microchip substrate 90 and while the hone is applying pressure onto a center portion of the microchip substrate 90, the ultrasonic waves are radiated onto the microchip substrates 80 and 90 so as to bond the microchip substrates 80 and 90.

Figure 5A:
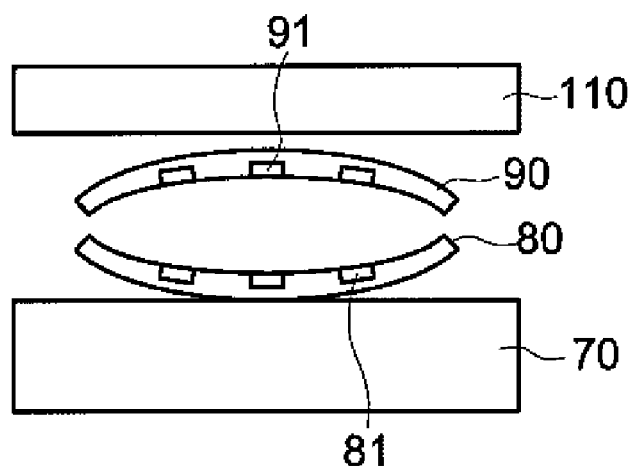
FIGS. 5a and 5b are cross-sectional views of microchip substrates describing a microchip manufacturing method related to a second embodiment of the present invention.
Figure 5B:
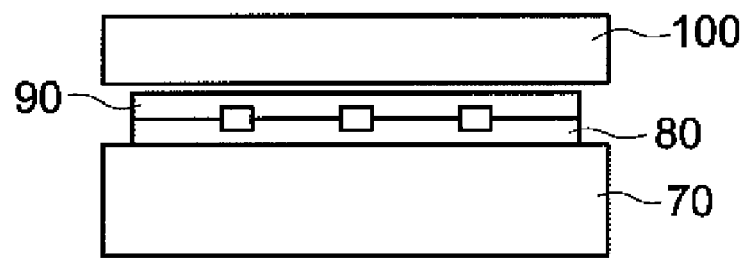

In case of laser welding, for example, as FIG. 5a shows, a substrate 100, which transmits a laser having a wave length used in welding, presses the microchip substrate 90 and while the substrates 100 is applying pressure onto a center portion of the substrate, the laser is radiated so as to bond the microchip substrates each other as FIG. 5b shows. As the substrate 100, for example, a glass material is used. Meanwhile, in the example shown by the FIGS. 5a and 5b, while bonding of the microchip substrates 80 and 90 having the concave bonding surfaces has been described, bonding of the microchip substrates 50 and 60 having the convex bonding surface can be carried out by pressing the microchip substrates though the substrate 100 and radiating the laser.

Also, in case the microchip substrate 50 and the microchip substrate 60 each having the convex bonding surface are bonded, an adhesive can be sued. In case of the microchip substrates having convex bonding surfaces, since a residual adhesive is pushed outside the substrate, the microchip substrates can be bonded evenly each other.

Meanwhile, in the aforesaid first embodiment and the second embodiment, the examples using SiO₂ film have been described as the example of the functional film. As another example of the functional film, for example, fluorine series resin films can be used. In case of the fluorine series resin films are used in the functional film forming process, a fluorine series resin film is formed on a surface where the flow path channel is formed in the same manner as the first embodiment, and in the functional film exfoliation process, the film except the film formed the inner surface of the flow path channel is removed by the adhesive member. By exfoliation of the functional film in the functional film exfoliation process, the functional film having a molecule adsorption function and a water-repellent property against liquid reagent can be preserved in the inner surface of the micro flow path and the resins can be bared at the bonding surfaces.

EXAMPLE

In the example, a specific example of the microchip forming method related to the first embodiment will be described.
<Forming Microchip Substrate>

A cyclic polyolefin resin (Zeonor™, manufactured by Zeon Corp.) representing a transparent resin was molded by an injection mold machine so as to form a flow path side microchip substrate where a plurality of flow path channels having a width of 50 μm and a depth of 50 μm, and a plurality of through holes having an inner diameter of 2 mm are formed on a plate shape member having external dimensions of 50 mm×50 mm×1 mm. The flow path side microchip substrate represents the microchip substrate 10 on which the flow path channel 11 in the aforesaid first embodiment was formed.

Also, in the same manner, a cover microchip substrate where a plurality of flow path channels having a width of 50 μm and a depth of 30 μm are formed on a plate shape member having external dimensions of 50 mm×50 mm×1 mm was formed.

The plurality of the flow path channels formed on the flow path side microchip substrate and the plurality of the flow path channels formed on the cover side microchip substrate are formed in patters which coincide each other when the substrates are faced each other.

The cover side microchip substrate represents the microchip substrate 20 where the flow path channel 21 in the aforesaid first embodiment is formed.
<Forming SiO₂ Film>

The SiO₂ film was formed on the surfaces (bonding surfaces) of the flow path side microchip substrate and the cover side microchip substrate on which the flow path channels are formed, using a CVD device (SAMCO International Inc. PD-270ST™) in the functional film forming process. As an ingredient of CVD, TEOS™ (Tetra Ethoxy Silane) was used. The SiO₂ film of 200 nm was formed with a flow amount of 12 sccm, an oxygen gas flow amount of 400 sccm, a RF output of 300 W, a pressure of 50 Pa and a film forming rate of 3 nm/sec. Owing to use of the CVD device, the SiO₂ film was formed uniformly even inside the flow path channel having the width of 50 μm and the depth of 50 μm and the flow path channel having the width of 50 µm and depth of 30 µm. A thickness of the SiO$_2$ film inside the flow path channel was 130 nm.

<Exfoliation>

Next, the SiO$_2$ film formed on the surface except the SiO$_2$ film formed on the surfaces of the flow path channels of the flow path side microchip substrate and the cover side microchip substrate is exfoliated using the cohesive member in the functional film exfoliation process. In the example, as the cohesive member, a cohesive tap No. 405 of NICHIBAN Co., Ltd. was used. The thickness of the cohesive member used was 0.05 mm, the width was 50 mm and the cohesive force was 4.00 N/cm$^2$.

By exfoliation, the SiO$_2$ film formed on the surface except the SiO$_2$ film formed on the surface of the flow path channel was exfoliated for both the flow path side microchip substrate and for the cover side microchip substrate, while preserving the SiO$_2$ films formed inside the flow path channels of the flow path side microchip substrate and the cover side microchip substrate without being exfoliated.

<Bonding>

In a bonding process, the flow path side microchip substrate and the cover side microchip substrate were placed so that the flow path channel side thereof face inside, and the flow path channels of both the substrates are positioned each other, then a laser welding machine scanned at a scanning speed of 10 mm/sec with an output of 5W so as to weld the substrates each other.

<Evaluation>

Through the above processes, the microchip wherein the micro flow path whose inner surface is covered by the SiO$_2$ film is formed. Also, since the SiO$_2$ film does not exist on the bonding surfaces of the flow path side microchip substrate and the cover side microchip substrate, the resin can be contacted each other, thus microchip substrates can be bonded by laser welding. According to the embodiment, the microchip having the micro flow path whose inner surface is covered by the SiO$_2$ film was able to manufacture readily.

Meanwhile, in the above example, while the substrates were bonded through laser welding, the substrates can be bonded by thermocompression or by ultrasonic wave welding. Also, in the example, while the SiO$_2$ film was used as an example of the functional film, use of the fluorine series resin film can produce the same effect.

What is claimed is:

1. A manufacturing method of a microchip having two resin substrates wherein a flow path channel is formed on a surface of at least one of the two resin substrates and the two resin substrates are bonded in such a way that the surface on which the flow path channel is formed faces inside, comprising the steps of:

forming a functional film on the surface on which the flow path channel is formed, which represents a first step;

delaminating the functional film by a cohesive member after the cohesive member is adhered on the surface on which the functional film is formed, except on a surface of the flow path channel, which represents a second step; and bonding the two resin substrates after the second step in such a way that the surface on which the flow path channel is formed faces inside, which represents a third step.

2. The manufacturing method of the microchip of claim 1 wherein, the flow path channel is formed on each surface of the two resin substrates, and the two resin substrates are bonded in such a way that the surfaces on which the flow path channels are formed face inside and positions of the flow path channels are aligned for bonding, in the a third step.

3. The manufacturing method of the microchip of claim 1, wherein the functional film is a SiO$_2$ film.

4. The manufacturing method of the microchip of claim 1, wherein the functional film is formed by coating and curing a coating solution of the functional film on the surface on which the flow path channel is formed in the first step.

5. The manufacturing method of the microchip of claim 1, wherein the functional film is formed by sputtering in the first step.

6. The manufacturing method of the microchip of claim 1, wherein the functional film is formed by CVD in the first step.

7. The manufacturing method of the microchip of claim 1, wherein the two resin substrates are bonded by melting bonding surfaces in such a way that the surfaces on which the flow path channels are formed face inside in the third step.

8. The manufacturing method of the microchip of claim 1, wherein the bonding surfaces are melted by heating the two resin substrates, and the two resin substrates are bonded by pressing the two resin substrates in such a way that the surfaces on which the flow path channels are formed face inside in the third step.

9. The manufacturing method of the microchip of claim 1, wherein the bonding surfaces are melted by applying ultrasonic waves onto the two resin substrates, and the two resin substrates are bonded by pressing the two resin substrates in such a way that the surfaces on which the flow path channels are formed face inside in the third step.

10. The manufacturing method of the microchip of claim 1, wherein the bonding surfaces are melted by radiating laser onto the two resin substrates, and the two resin substrates are bonded by pressing the two resin substrates in such a way that the surfaces on which the flow path channels are formed face inside in the third step.

11. The manufacturing method of the microchip of claim 1, wherein the cohesive member is in a shape of a sheet.

* * * * *